United States Patent [19]

Fournel et al.

[11] Patent Number: 5,440,263
[45] Date of Patent: Aug. 8, 1995

[54] VOLTAGE THRESHOLD DETECTION CIRCUIT WITH VERY LOW POWER CONSUMPTION

[75] Inventors: Richard P. Fournel, Trets; Laurent Sourgen, Aix-en-Provence, both of France

[73] Assignee: SGS-Thomson Microelectronics, S.A., Gentilly, France

[21] Appl. No.: 53,892

[22] Filed: Apr. 27, 1993

[30] Foreign Application Priority Data

Apr. 30, 1992 [FR] France .................. 92 05425

[51] Int. Cl.⁶ .............................................. G05F 1/00
[52] U.S. Cl. .................................. 327/546; 327/143; 377/60
[58] Field of Search .................... 327/74, 427, 391, 64, 327/94, 187, 296.4, 354, 571, 529, 296.5, 350, 353, 272.1, 272.3, 246, 203, 403, 546, 143; 322/60

[56] References Cited

U.S. PATENT DOCUMENTS

| | | | |
|---|---|---|---|
| B 389,726 | 1/1975 | Griffin | 328/150 |
| 4,065,766 | 12/1977 | Butler et al. | 377/60 |
| 4,137,464 | 1/1979 | Heller et al. | 377/60 |
| 4,181,865 | 1/1980 | Kohyama | 377/60 |
| 4,254,345 | 3/1981 | Ullrich | 377/60 |
| 4,468,798 | 8/1984 | Riebeek | 307/521 |
| 4,932,053 | 6/1990 | Fruhauf et al. | 380/4 |
| 4,952,796 | 8/1990 | Fruhauf et al. | 307/311 |
| 5,099,451 | 3/1992 | Sourgen et al. | 365/185 |
| 5,101,121 | 3/1992 | Sourgen | 307/465 |

FOREIGN PATENT DOCUMENTS

| | | | |
|---|---|---|---|
| 0066300 | 4/1986 | Japan | 307/353 |
| 0154395 | 6/1990 | Japan | 307/353 |
| 0040300 | 2/1991 | Japan | 307/353 |
| 2045563 | 10/1982 | United Kingdom | |

OTHER PUBLICATIONS

Ser. No. 07/857,732, Mar. 26, 1992, Circuit for the Detection of a High Threshold of a Supply Voltage.
Ser. No. 07/490,615, Sep. 27, 1988, Device for Protecting Memory Areas of an Electronic Microprocessor System.
Ser. No. 07/272,094, Nov. 16, 1988, Monolithic Electronic Component.
Ser. No. 07/623,510, Dec. 7, 1990, MOS Fuse with Programmable Tunnel Oxide Breakdown.
Ser. No. 07/113,488, Oct. 20, 1987, Method for Addressing of a Memory and Address Counter for the Application of the Method.

Primary Examiner—Timothy P. Callahan
Assistant Examiner—Dinh Le
Attorney, Agent, or Firm—Robert Groover; Betty Formby

[57] ABSTRACT

A supply-voltage-monitoring circuit, for low-power integrated circuits, in which charge-sharing through a switched-capacitor chain is used to couple the supply voltage to a dynamic sensing node. The dynamic sensing node drives a half-latch, which is stable in a no-alarm condition. In this circuit, the state of the output gets switched over in the first phase if the voltage at the terminals of the capacitor at the start of this stage (this voltage being equal to a fraction of the input voltage) crosses a determined threshold. This threshold is determined as a function of technical parameters for the construction of the circuit. These technical parameters are chiefly the threshold voltage of the transistor and the characteristics of the transistors that form the locking circuit.

60 Claims, 2 Drawing Sheets

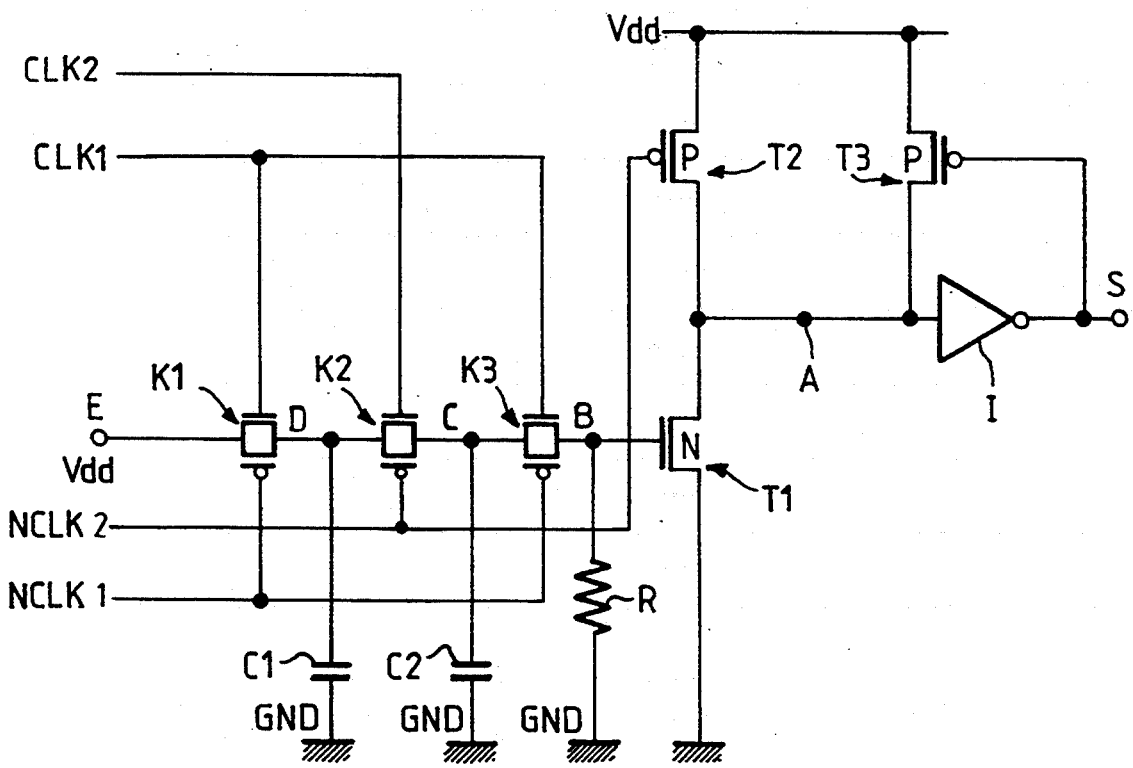
FIG_1
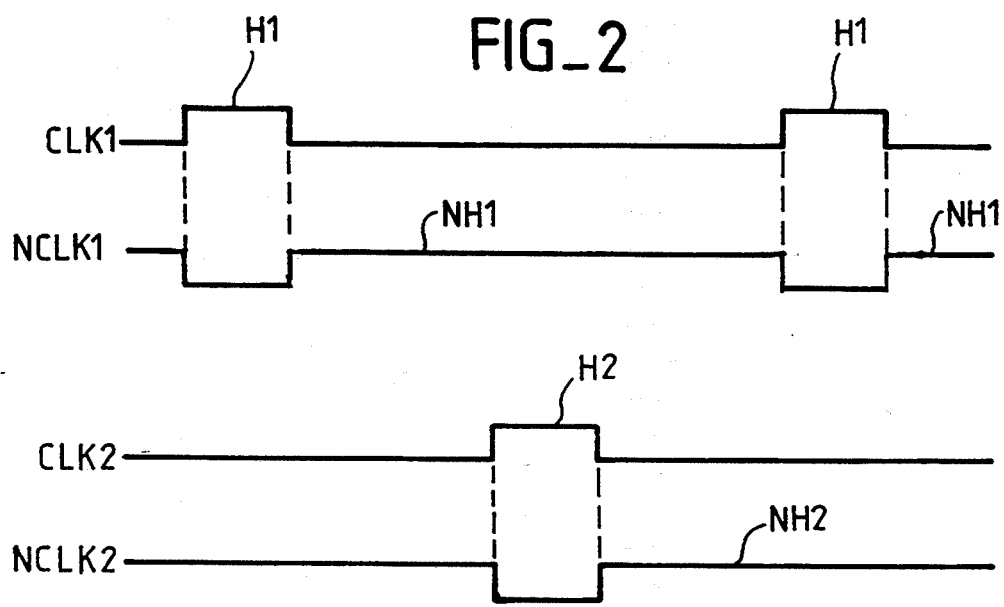
FIG_2

VOLTAGE THRESHOLD DETECTION CIRCUIT WITH VERY LOW POWER CONSUMPTION

CROSS-REFERENCE TO RELATED APPLICATION

This application claims priority from French App'n 92-05425, filed Apr. 30, 1992, which is hereby incorporated by reference.

BACKGROUND AND SUMMARY OF THE INVENTION

The invention relates to circuits for monitoring an integrated circuit's supply voltage and delivering a signal when the level is crossed, either upwards or downwards.

For example, it may be necessary to inhibit the operation of an integrated circuit when its supply voltage crosses upper or lower limit values. The signal produced in case of the detection of a crossing of a limit is then used to stop the operation of the circuit. The reason for this may be, for example, that this excessively high or excessively low voltage might give rise to abnormal operation, and that a pure and simple interruption of the operation is preferable to abnormal operation. This problem is encountered notably in applications where the integrated circuit is used to manage confidential data or data representing a market value. This occurs for example in chip cards where this data is stored in an electrically programmable memory.

This is why it has already been proposed to incorporate a circuit to detect the crossing of a supply voltage threshold level into an integrated circuit. However, the circuits commonly used have the drawback that the average current that they consume is too great. These circuits generally use a branch in which there permanently flows a DC current. The magnitude of the consumption is in the range of 75 microamperes at 5 volts, and it would be desirable to reduce this consumption. Indeed for contactless card applications, where the available energy is low, or for cards inserted into equipment carried on board (equipment such as radiotelephones), the operating voltage is in the range of 3 volts and the consumption needs to be reduced to the minimum.

The invention proposes an innovative low-power circuit to detect a crossing of a voltage threshold level. Advantages of this circuit include:
it is very simple;
the average current it consumes is very low; and
it enables the detection of any crossing of a voltage threshold, even by the supply voltage itself.

According to the invention, there is proposed a circuit for the detection of the overrunning of the level of an input voltage, said circuit comprising at least one first capacitor and one second capacitor and a set of switches actuated successively and arranged so that:
  in a first phase, they apply the input voltage to the terminals of the first capacitor and apply the voltage present at the terminals of the second capacitor to the gate of a detection transistor, the two capacitors being isolated from each other;
  in a second phase, they connect the two capacitors so that the second one is charged by the first one, the capacitors being insulated from the input and from the gate of the detection transistor, the circuit furthermore comprising a means to precharge the drain of the detection transistor during the first stage, a means to discharge the second capacitor during the first stage and a circuit to latch the logic level of the drain of the detection transistor.

In this circuit, the state of the output gets switched over in the first phase if the voltage at the terminals of the capacitor at the start of this phase (this voltage being equal to a fraction of the input voltage) crosses a determined threshold. This threshold is determined as a function of technical parameters for the construction of the circuit. These technical parameters are chiefly the threshold voltage of the transistor and the characteristics of the transistors that form the latching circuit.

The latching circuit tends to maintain the logic level for the pre-charging of the drain of the detection transistor, but the voltage threshold crossing to be detected makes the detection transistor conductive in a manner that is preponderant with respect to the action of the latching circuit, thus inverting the logic level of the drain. After switching over, the latching circuit stops tending to maintain the drain of the detection transistor at the precharging logic level.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows the preferred embodiment of the invention;

FIG. 2 shows a timing diagram of the clock signals used in the circuit.

DESCRIPTION OF THE PREFERRED EMBODIMENTS

Figure 3:
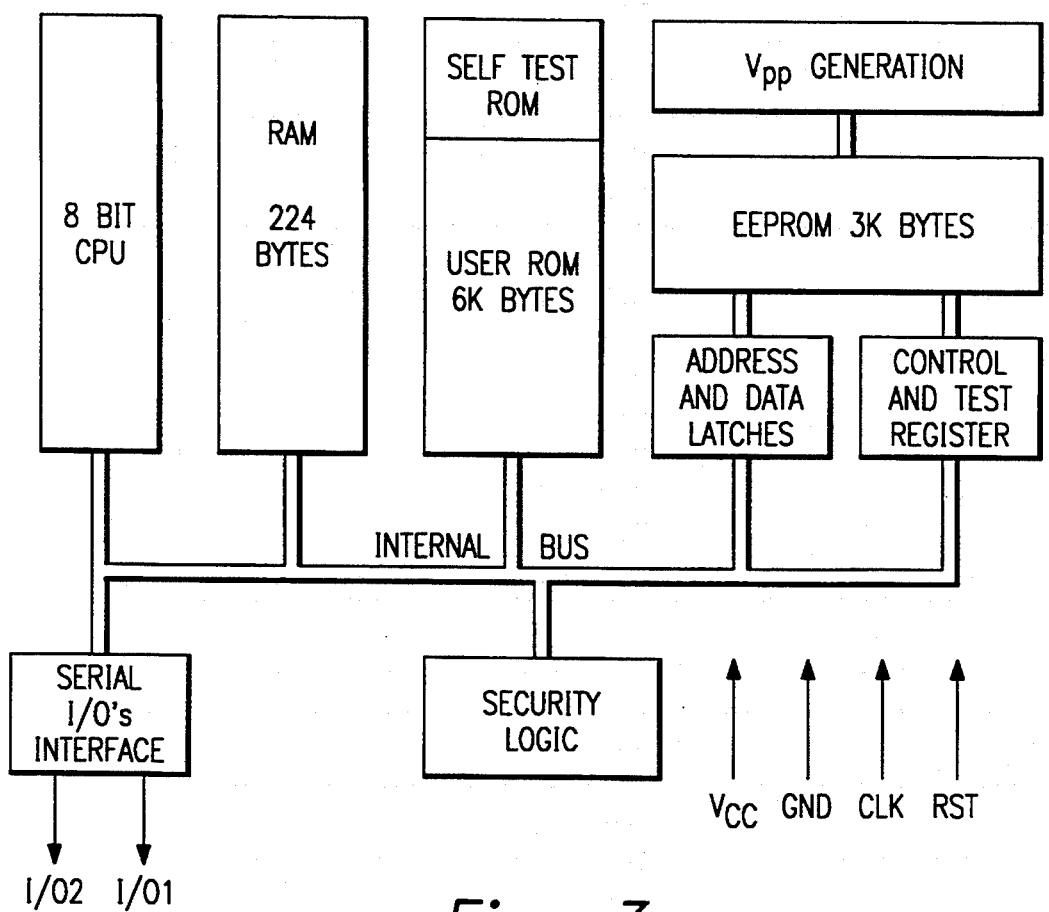
FIG. 3 shows a secure smart-card microcontroller chip, which advantageously employs the circuit of FIG. 1 to achieve a smart-card architecture with increased security.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The invention shall be described in relation to a preferred embodiment in which the circuit of the invention is incorporated into an integrated circuit chip that comprises other circuits and in which it is sought to detect the crossing of a limit value of the supply voltage Vdd of this circuit. However, the invention is not restricted to this case: the circuit may be used to monitor voltages other than the supply voltage Vdd.

The preferred embodiment of the invention is the circuit of FIG. 1. Only the integrated circuit part corresponding to the detection circuit according to the invention is shown. The other circuits of the chip are not shown and may be any circuits. The detection comprises an output S which gives an upper or top logic level when a crossing of the maximum permitted voltage is detected and which, if this is not the case, remains permanently at the lower or bottom logic level. The passing of the output to the top level is used, for example, to inhibit the operation of all or a part of the rest of the integrated circuit, in a manner that is standard and is not shown.

The detection circuit is supplied, like the other circuits of the chip, by the supply voltage Vdd, referenced with respect to a ground terminal GND. The voltage Vdd is conventionally equal to about 5 volts or 3 volts.

The circuit comprises an input terminal E which receives the voltage to be monitored. In the presently preferred embodiment, the supply voltage Vdd is applied to this input E.

The circuit has three main parts. The first part has the function of making samplings, preferably periodically, of the voltage applied to the input E and of reducing this voltage in a capacitive divider in order to apply the reduced sampled voltage to the gate of a detection transistor. When the operation is not periodic, the sampling may be related to the sequence achieved by a microprocessor of the circuit, for example in synchronization with programming operations prompted by this microprocessor. The function of the second part is to do the detection itself and, to this end, this second part uses a detection transistor and a means for the precharging, periodically or in synchronization with the sequence, of the drain of this transistor. The third part has the function of latching the precharging logic level of the detection transistor so long as there is no crossing of a threshold. In the rest of the description here below, a periodic circuit will be described, but the triggering signals can be produced, as desired, by a different system of synchronization. Furthermore, it will be noted that, if the periods are not regular (in the event of synchronization), only the alternating successive character of the different signals is important.

In the preferred embodiment, the first part comprises a first switch K1 connecting the input E to a terminal (node D) of a first capacitor C1. The other terminal of the capacitor 1 is connected to the ground GND. The switch K1 is closed periodically during a square wave peak H1 of the clock signal. It is open for the rest of the time.

In a standard way, the switch K1 is then formed by a pair of complementary MOS transistors in parallel. One of these MOS transistors (an N channel transistor) is controlled by a signal CLK1 of a first clock (giving the positive voltage peaks H1) and the other MOS transistor (a P channel transistor) is controlled by the complementary signal NCLK1 of this first clock, giving complementary positive peaks NH1.

A second switch K2, activated in an opposite phase with respect to the switch K1, connects a terminal (node C) of a second capacitor C2 to the first terminal (D) of the capacitor C1. The other terminal of C2, like that of C1, is connected to the ground GND.

Like the switch K1, the switch K2 is preferably constituted by a pair of complementary transistors, but this time the N channel transistor is controlled by a signal CLK2 of a second clock while the P channel transistor is controlled by the complementary signal NCLK2 of this second clock. The two clocks are phase-shifted, as shown in FIG. 2. The peak H1 of the first clock signal is present when the peak H2 of the second clock signal is absent and vice versa.

The switch K2 is therefore on during the peaks H2 and off during the peaks NH2.

The two capacitors form a capacitive voltage divider, the reduction ratio of which depends on the respective values of the two capacitors.

The first terminal of the second capacitor (node C) is connected to the gate (node B) of a detection transistor T1 by a third switch K3 constituted like the switch K1 and actuated periodically, with the same phase as K1, by the clock signals CLK1 and NCLK1.

A resistor R, connected between the node B and the ground GND, enables the gradual discharging of the capacitor C2 when the switch K3 is closed.

This first part of the circuit works in the following way at each period:

- in a first phase represented by the clock signal peaks H1, the capacitor C1 is charged at the voltage Vdd present at the input E. During this first stage, it is assumed that the second capacitor C has the time to get completely discharged in the resistor R through the switch K3;
- in a second phase, the clock signals CLK1, CLK2; NCLK1 and NCLK2 open the switches K1 and K3 and then close the switch K2. The charge of the capacitor C1 is distributed between the two capacitors C1 and C2, proportionally to their value. The voltage at the terminals of the capacitor C2 takes a value Vdd C·1/(C1+C2). It is this voltage that will be applied by the switch K3 to the detection transistor T1 during the first phase of the next sampling period.

It will be noted that the clock signal peaks H1 and H2 should not overlap at the top logic level, i.e. there should be a drop from the peak H1 back to the bottom level just before the peak H2 goes to the top level. FIG. 2 shows the corresponding clock diagrams. It will be noted also that the peaks may be (and preferably are) asymmetrical, the peaks H1 or H2 being shorter than the peaks NH1 or NH2 in order to minimize the time during which current for consumption is taken from the supply.

The second part of the circuit according to the invention comprises more specifically the detection transistor T1 and the resistor R, and a precharging transistor T2. The gate of T1 is connected to the node B, the source is connected to the ground GND, and the drain is connected to the node A, which may be precharged at a determined potential (preferably quite simply Vdd) by the transistor T2. Herein, the transistor T1 is an N channel transistor.

The precharging transistor T2 is then preferably a P channel transistor having its drain connected to the node A, its source connected to the supply voltage Vdd and its gate controlled by the clock signal NH2. The node A is precharged at Vdd during the second stage (peaks H2). Depending on the voltage applied to the gate of T1 during the following first phase, the potential of the node A will drop to a greater or to a smaller extent, and will cause the logic level of the output S of the circuit to switch over or not switch over.

The third part of the circuit according to the invention comprises the circuit for latching the top logic level of the node A. This part comprises, firstly, an inverter I, the input of which is connected to the node A and the output of which constitutes the output S of the circuit of the invention, and, secondly, a feedback transistor T3 used to lock the top logic state of the node A.

In this embodiment, the feedback transistor T3 is a P channel transistor having its drain connected to the node A, its source connected to the voltage Vdd and its gate controlled by the output S of the inverter I. It can be seen that if the node A is at a top logic level, the output S of the inverter is at the bottom level and makes the transistor T3 conductive, confirming the top logic level of the node A. On the contrary, if the node A goes to the bottom level, the transistor T3 goes off and no longer acts on the node A.

The second and third parts of the circuit according to the invention work as follows: during the second stage of each sampling period, the node A is precharged at Vdd (top logic level). The latching circuit confirms this level and places the output S at the bottom logic level. Then, at the first phase of the next period, the precharging transistor T2 is off and no longer plays a role, but the feedback transistor T3 maintains the top logic level of the node A. During this time, the voltage of the capacitor C2 is applied to the node B, i.e. to the gate of the detection transistor T1.

Conflict then arises between the transistor T3 which tends to keep the node A at the top logic level and the transistor T1 which tends to become conductive because of the voltage applied to its gate. Depending on the value of the voltage applied to the gate, i.e. depending on the input voltage E sampled in the previous phase, the transistor T1 will or will not become conductive enough to make the potential of the node A drop to the bottom logic level making it possible to achieve the switching over of the inverter I.

If the inverter does not switch over, the transistor T3 continues to fulfill its role of a circuit for latching the top level of the node A. The output S remains at the bottom logic level. If the inverter switches over, the output goes to the top state; the transistor T3 goes off; the node A becomes insulated from the voltage Vdd (T3 and T2 off); its potential cannot rise again and the logic state of the output S remains at the top level up to the next precharging phase. Hence, should there be an overrunning of the threshold of input voltage, an output pulse is obtained with a duration related to the lag between the two clocks.

It is seen that, in this way, a detector with a threshold is made, the threshold of said detector depending on:
- the ratio of the values of the capacitors C1 and C2 (but with correctives related to the presence of parasitic capacitances, if any, in the circuit);
- the relative dimensions of the transistor T1 and of the transistor T3, since the transistor T1 should be capable of drawing the potential of the node A downwards despite the contrary influence of the transistor T3;
- the relative dimensions of the input transistors of the inverter I, since the switch-over threshold of the inverter depends on the characteristics of its input transistors.

The role of the resistor R is to enable the capacitor C2 to be completely discharged at the end of the first phase. There is therefore a compromise to be achieved between a value of R that is low enough to obtain a complete discharge before the end of the first phase and a value of R that is high enough for the transistor T1 to be made readily conductive should the accepted voltage limit be crossed, before the capacitor C2 is excessively discharged.

It is desirable for the conductivity of the feedback transistor T3 to be as low as possible (this is a "long" transistor having a very small ratio of channel width to channel length, for example a ratio of 2 micrometers to 100 micrometers) to reduce the consumption of the circuit and permit the switch-over of the level of the node A under the influence of the transistor T1. This transistor T1 is preferably small to give high measuring precision.

For example, its dimensions are: width 2 micrometers and length 2 micrometers in order to minimize the parasitic capacitive division between C2 and the gate capacitance of T2. Indeed, the voltage applied instantaneously to the gate of T1 is a function of C2 and of the gate capacitance of T1.

It is desirable for the nodes B, C and D to have parasitic capacitances that are not excessively high. By contrast, the parasitic capacitance of the node A is not troublesome because, by being greater, it would enable a reduction in the ratio W/L of T3 and hence a reduction in consumption.

A description has thus been given of a circuit to detect the crossing of voltage thresholds. This circuit consumes only a small amount of current. In particular, if the clocks CLK and NCLK are asymmetrical, i.e. more specifically if the logic peaks H are shorter than the logic peaks NH, then the consumption is reduced. Indeed, one factor of current consumption is the period during which the transistor T1 and the transistor T3 are simultaneously conductive (the conduction of T1 being generally not enough to cause the switch-over of the node A but being, nevertheless, a partial conduction). The only limit to the duration of the peaks H is that they should be long enough for the capacitor C2 to be totally discharged at the end of the peak while, however, the value of the resistor R should be high enough to maintain the conduction of the transistor T1 for a period sufficient to produce the switch-over of the level of the node A (should there be a crossing of a threshold) until the locking of the transistor T3. The clock H may be one with a relatively low frequency (some tens of kilohertz for example).

Much of the foregoing specific discussion has related primarily to overvoltage detection. To achieve undervoltage detection, in a practical circuit, two circuits with different C1/C2 values would be utilized.

Note that the feedback of inverter I provides only a half-latch (i.e. there is no active pull-down corresponding to T3). Note that the "no-alarm" state is automatic, since T1 pulls down the A node to zero. The circuit is stable as such and the consumption is minimum since in this case T2 and T3 are off.

The depicted circuit will work as soon as the power supply is at 2 Volts. Thus it is not necessary to wait for the falling down of a POR signal. However, in practice, since optimal operation is affected by the quality of the clock, the output would normally be inhibited till the circuit is initialized.

In the sample embodiment shown, suppression of clock CLK2 would prevent line S from ever going high. Since detection of overvoltages is useful for maintaining the security of smart-card chips, proper operation of the clocks is also preferably protected in secure applications. (A low-speed clock common to the circuit is preferably utilized.) In the presently preferred embodiment, the frequency of the clock is 7 MHz; the period value is 140 ns; and the pulse duration is 50 ns.

An example of sample design dimensions, for a sample embodiment with Vdd=5 V, is as follows. Of course, these specific values are merely illustrative, and designers of ordinary skill will recognize how to vary them:

C1=100 fF (85 square microns);

C2=400 fF (330 square microns);

Resistor R=60 KOhms (using a lightly doped N diffusion with sheet of 1.8 kOhms/square);

T1 W/L=2/2 μ;

T2 W/L=6/2 μ;

T3 W/L=2/100 μ;

NMOS transistors for K1 K2 K3 or I: W/L=2/2 μ;

PMOS transistors for K1 K2 K3 or I: W/L=6/2 μ.

Sample Microcontroller Embodiment

FIG. 3 shows a secure smart-card microcontroller, which advantageously employs the circuit of FIG. 1 to achieve a smart-card architecture with increased security. This is a serial access microcontroller perfectly suited to applications where low voltage or low power consumption are mandatory. On chip memories include 224 bytes of RAM, 6K bytes of ROM, and 3K bytes of EEPROM.

This part operates with supply voltages from 2.7 V to 5.5 V, allowing it to be used in applications that require low power consumption or operation over an extended voltage range. The device contains 6 Kbytes of ROM, 2 Kbytes of EEPROM and 224 bytes of RAM. This part also includes built-in security mechanisms.

The 2.7 V minimum operating voltage means that this part can be safely operated from 3 V±10% supplies, while its very low 2 mA active and 10 μA standby currents make it ideal for use in portable equipment, contactless card systems and other applications where low power-consumption is a key requirement. It is also fully compliant with the ISO 7816-3 standard when operated at the nominal 5 V supply.

Other features of this part include two serial I/O ports, 2 MHz internal operating frequency, a popular industry standard CPU architecture, and a highly reliable CMOS EEPROM technology, with an endurance of 100,000 Write/Erase, cycles and a ten year data retention.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, more complex voltage detection stages can optionally be substituted for the simple NMOS T1. For example, in some embodiments both clocks may have a duty cycle of less than 30%. For example, a string of diodes could optionally be used, but the device would then (undesirably) be more sensible to parameter variation due to the manufacturing process.

For example, the actual implementation of the inverter I would typically use more complex logic gates (e.g. NAND or NOR gates gated by a power-on reset ("POR") signal).

For another example, T3 could readily be combined with other elements (such as a PMOS depletion in series with T3), to provide reduced power and/or optimal biasing of node A. However, this is not currently contemplated as preferable.

Alternatively and less preferably, T3 could be replaced by an unclocked load element (such as an intrinsic-poly load); but then it is still necessary to have a latch at the output for maintaining the level.

Alternatively and less preferably, switches K1 through K3, which are now configured as transmission gates, could be configured as simple PMOS switches; however, this is not preferred, since the device would be too sensible to dispersions due to the manufacturing process.

Alternatively and less preferably, some (but not all) advantages of the full circuit could still be obtained if capacitor C1 and switch K1 were omitted. (Of course, this embodiment would sacrifice the feature of voltage-division by selection of the C1:C2 ratio.) In this case having diodes series mounted with the source of T1 would be necessary. Also the device would be sensible to process-dependent parameter variation.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   a connection for receiving a power-supply voltage;
   connections for receiving first and second clock signals;
   a voltage-detection circuit, powered from said power-supply voltage, having an input node, and connected to provide an output at an output node in a first state when and only when the voltage of said input node passes a predetermined limit voltage; and
   a charge-transfer circuit, interposed between said power-supply voltage connection and said voltage-detection circuit, and comprising:
   first and second capacitors, having respective capacitances in a predetermined ratio;
   a first clocked switch connected to transfer said power-supply voltage onto said first capacitor, on an active phase of said first clock signal; and
   a second clocked switch connected to connect said first and second capacitors, to effect charge sharing therebetween, on an active phase of said second clock signal; and
   a third clocked switch connected to connect said second capacitor to said input node of said voltage detection circuit on an active phase of said first clock signal; and
   logic circuitry, powered from said power-supply voltage, and connected to receive the output of said voltage-detection circuitry, and connected to provide an alarm signal when said output of said voltage-detection circuitry enters said first state.

2. The integrated circuit of claim 1, wherein both said clock signals are received both in true and in complemented forms, and each said switch consists of a parallel combination of an N-channel transistor with a P-channel transistor.

3. The integrated circuit of claim 1, wherein said voltage-detection circuit comprises a transistor, clocked by said second clock signal, which forces the output of said voltage detection circuit out of said first state during an active phase of said second clock signal.

4. The integrated circuit of claim 1, wherein said voltage detection circuit comprises a field-effect transistor having a gate connected to said input node.

5. The integrated circuit of claim 1, wherein said voltage-detection circuit provides said output in said first state when the voltage at said input node rises above said predetermined limit voltage.

6. The integrated circuit of claim 1, wherein said logic circuitry includes latching circuitry connected to hold an output of said logic circuitry in a no-alarm condition, but not to hold said output of said logic circuitry in an alarm condition.

7. The integrated circuit of claim 1, wherein both said first and second clock signals have duty cycles of less than 30%.

8. The integrated circuit of claim 1, wherein said first and second clock signals are non-overlapping.

9. An integrated circuit, comprising:
a connection for receiving a power-supply voltage;
connections for receiving first and second clock signals;
a voltage-detection circuit, powered from said power-supply voltage, having an input node, and Connected to provide an output in a first state when and only when the voltage of said input node passes a predetermined limit voltage; and
a charge-transfer circuit, interposed between said power-supply voltage connection and said voltage-detection circuit, and comprising:
at least one capacitance;
clocked transfer switches connected to transfer a voltage from said power-supply voltage connection onto said capacitance, and to transfer a voltage from said capacitance onto said input node on an active phase of said first clock signal; and
a clocked precharge switch connected to fix the voltage of said output of said voltage-detection circuit on an active phase of said second clock signal; and
logic circuitry, powered from said power-supply voltage, and connected to receive the output of said voltage-detection circuitry, and connected to provide an alarm signal when said output of said voltage-detection circuitry enters said first state.

10. The integrated circuit of claim 9, wherein both said clock signals are received both in true and in complemented forms, and each said switch consists of a parallel combination of an N-channel transistor with a P-channel transistor.

11. The integrated circuit of claim 9, wherein said voltage-detection circuit comprises a transistor, clocked by said second clock signal, which forces the output of said voltage-detection circuit out of said first state during an active phase of said second clock signal.

12. The integrated circuit of claim 9, wherein said voltage-detection circuit comprises a field-effect transistor having a gate connected to said input node.

13. The integrated circuit of claim 9, wherein said voltage-detection circuit provides said output in said first state if the voltage at said input node rises above said predetermined limit voltage.

14. The integrated circuit of claim 9, wherein said logic circuitry includes latching circuitry connected to hold an output of said logic circuitry in a no-alarm condition, but not to hold said output of said logic circuitry in an alarm condition.

15. The integrated circuit of claim 9, wherein said first and second clock signals are non-overlapping.

16. An integrated circuit, comprising:
a connection for receiving a power-supply voltage;
connections for receiving first and second clock signals;
a voltage-detection circuit, powered from said power-supply voltage, having an input node, and connected to provide an output in a first state when and only when the voltage of said input node passes a predetermined limit voltage; and
a charge-transfer circuit, interposed between said power-supply voltage connection and said voltage-detection circuit, and comprising:
first and second capacitors, having respective capacitances in a predetermined ratio;
a first clocked switch connected to transfer said power-supply voltage onto said first capacitor, on an active phase of said first clock signal; and
a second clocked switch connected to connect said first and second capacitors, to effect charge sharing therebetween, on an active phase of said second clock signal; and
a third clocked switch connected to connect said second capacitor to said input node of said voltage detection circuit on an active phase of said first clock signal; and
logic circuitry, powered from said power-supply voltage connected to receive the output of said voltage-detection circuitry, and connected to provide an alarm signal when said output of said voltage-detection circuitry enters said first state;
a load element connected to pull said input node away from said limit voltage, and thereby prevent said output of said voltage-detection circuitry from entering said first state, at least during an active phase of said second clock signal.

17. The integrated circuit of claim 16, wherein both said clock signals are received both in true and in complemented forms, and each said switch consists of a parallel combination of an N-channel transistor with a P-channel transistor.

18. The integrated circuit of claim 16, wherein said voltage-detection circuit comprises a transistor, clocked by said second clock signal, which forces the output of said voltage-detection circuit out of said first state during an active phase of said second clock signal.

19. The integrated circuit of claim 16, wherein said voltage-detection circuit comprises a field-effect transistor having a gate connected to said input node.

20. The integrated circuit of claim 16, wherein said voltage-detection circuit provides said output in said first state when the voltage at said input node rises above said predetermined limit voltage.

21. The integrated circuit of claim 16, wherein said logic circuitry includes latching circuitry connected to hold an output of said logic circuitry in a no-alarm condition, but not to hold said output of said logic circuitry in an alarm condition.

22. The integrated circuit of claim 16, wherein said load element is not clocked.

23. The integrated circuit of claim 16, wherein said load element consists of a resistor.

24. The integrated circuit of claim 16, wherein both said first and second clock signals have duty cycles of less than 30%.

25. The integrated circuit of claim 16, wherein said first and second clock signals are non-overlapping.

26. A circuit for the detection of the overrunning of the level of an input voltage, said circuit comprising:
at least one first capacitor and one second capacitor and a set of switches actuated successively and interconnected with said capacitors and a detection transistor so that:
in a first phase, said switches apply the input voltage to the terminals of said first capacitor and apply the voltage present at the terminals of said second capacitor to the gate of said detection transistor, said two capacitors being isolated from each other; and
in a second phase, said switches connect said two capacitors so that said second capacitor is charged by said first capacitor, said capacitors being insulated from the input and from the gate of said detection transistor;
means for precharging the drain of said detection transistor during said second phase,
means for discharging said second capacitor during said first phase, and
latch circuitry powered from said input voltage, and connected to latch the logic level of the drain of said detection transistor;
wherein said detection transistor is powered from said input voltage and is connected to be powered during some, but not all, portions of said first and second phases.

27. A circuit for the detection of the overrunning of the level of an input voltage, said circuit comprising:
at least one first capacitor and one second capacitor and a set of switches actuated successively and interconnected with said capacitors and a detection transistor so that:
in a first phase, said switches apply said input voltage to the terminals of said first capacitor and apply the voltage present at the terminals of said second capacitor to the gate of said detection transistor, said two capacitors being isolated from each other; and
in a second phase, said switches connect said two capacitors so that said second capacitor is charged by said first capacitor, said capacitors being insulated from the input and from the gate of said detection transistor;
means for precharging the drain of said detection transistor during said second phase,
means for discharging said second capacitor during said first phase, and
latch circuitry connoted to latch a logic level of the drain of said detection transistor;
wherein said detection transistor is connected to be powered during some, but not all, portions of said first and second phases;
wherein the latching circuit comprises an inverter having its input connected to the drain of the detection transistor, its output constituting an output of the circuit to detect the crossing of a voltage level, and a feedback transistor controlled by the output of said inverter and connected to the drain of said detection transistor.

28. A circuit according to claim 27, wherein said feedback transistor is a P channel transistor having its source connected to a supply voltage and its drain connected to the drain of said detection transistor.

29. A circuit according to claim 27, comprising an asymmetrical clock giving peaks of different durations for said first phase and said second phase.

30. A circuit according to claim 29, wherein said clock gives peaks that are shorter for said first phase than for said second phase.

31. A circuit according to claim 29, wherein the periodic peaks given by said clock for said first phase do not have any overlapping with the periodic peaks given for said second phase.

32. A circuit for the detection of the overrunning of the level of an input voltage, said circuit comprising:
at least one first capacitor and one second capacitor and a set of switches actuated successively and interconnected with said capacitors and a detection transistor so that:
in a first phase, said switches apply said input voltage to the terminals of said first capacitor and apply the voltage present at the terminals of said second capacitor to the gate of said detection transistor, the two capacitors being isolated from each other; and
in a second phase, said switches connect said two capacitors so that said second capacitor is charged by said first capacitor, said capacitors being insulated from the input and from the gate of said detection transistor;
means for precharging the drain of said detection transistor during said second phase,
means for discharging said second capacitor during the first phase, and
latch circuitry powered from said input voltage, and connected to latch the logic level of the drain of the detection transistor;
wherein said detection transistor is powered from said input voltage and is connected to be powered during some, but not all, portions of said first and second phases;
wherein said input voltage is connected to a voltage supply terminal of said circuit.

33. A circuit for the detection of the overrunning of the level of an input voltage, said circuit comprising:
at least one first capacitor and one second capacitor and a set of switches actuated successively and interconnected with said capacitors and a detection transistor so that:
in a first phase, said switches apply said input voltage to the terminals of said first capacitor and apply the voltage present at the terminals of said second capacitor to the gate of said detection transistor, said two capacitors being isolated from each other; and
in a second phase, said switches connect said two capacitors so that said second capacitor is charged by said first capacitor, said capacitors being insulated from the input and from the gate of said detection transistor;
means for precharging the drain of said detection transistor during said second phase,
means for discharging said second capacitor during said first phase, and
latch circuitry powered from said input voltage, and connected to latch the logic level of the drain of said detection transistor;
wherein said detection transistor is connected to be powered during some, but not all, portions of said first and second phases;
said circuit being incorporated into an integrated circuit chip and comprising an output capable of inhibiting the operation of said other circuits placed on the same chip, in the event of the overrunning of a voltage threshold at said input of said detection circuit or of the detection of a bottom threshold.

34. A method for detecting out-of-limits supply voltage in an integrated circuit, comprising the steps of:
transferring the supply voltage onto a first capacitor, on an active phase of a first clock; and
on an active phase of a second clock which is disjunct from said active phase of said first clock, connecting said first capacitor to a second capacitor which has a capacitance in a predetermined ratio to that of said first capacitor, to effect charge sharing therebetween;
connecting said second capacitor, on said active phase of said first clock, to an input of a voltage-detection circuit which is powered from the supply voltage and connected to provide an output in a first state when and only when the voltage at said input passes a predetermined limit voltage;
providing partial feedback to stabilize an output of said voltage-detection circuit out of said first state, but not in said first state; and
providing an alarm signal if said output of said voltage-detection circuitry enters said first state.

35. An integrated circuit, comprising:
a connection for receiving a power-supply voltage;
connections for receiving first and second clock signals having different respective active phases;
a voltage-detection circuit, powered from said power-supply voltage, having an input node, and connected to provide an output in a first state when and only when the voltage of said input node passes a predetermined limit voltage; and
a charge-transfer circuit, interposed between said power-supply voltage connection and said voltage-detection circuit, and comprising;
first and second capacitors, having respective capacitances in a predetermined ratio;
a first clocked switch connected to transfer said power-supply voltage onto said first capacitor, on an active phase of said first clock signal; and
a second clocked switch connected to connect said first and second capacitors, to effect charge sharing therebetween, on an active phase of said second clock signal; and
a third clocked switch connected to connect said second capacitor to said voltage detection circuit on an active phase of said first clock signal;
clocked precharge switches connected to intermittently precharge said output node of said voltage-detection circuit, during an active phase of said second clock signal, away from said first state; and
latching circuitry powered from said power-supply voltage, and connected to hold said output of said voltage-detection circuit out of said first state, but not to hold said output of said voltage-detection circuit in said first state.

36. The integrated circuit of claim 35, wherein both said clock signals are received both in true and in complemented forms, and each said switch consists of a parallel combination of an N-channel transistor with a P-channel transistor.

37. The integrated circuit of claim 35, further comprising an unclocked load element connected to said input node of said voltage-detection circuit.

38. The integrated circuit of claim 35, wherein said voltage detection circuit comprises a transistor, clocked by said second clock signal, which forces the output of said voltage-detection circuit out of said first state during an active phase of said second clock signal.

39. The integrated circuit of claim 35, wherein said voltage-detection circuit comprises a field-effect transistor having a gate connected to said input node.

40. The integrated circuit of claim 35, wherein said voltage detection circuit provides said output in said first state if the voltage at said input node rises above predetermined limit voltage.

41. The integrated circuit of claim 35, wherein both said first and second clock signals have duty cycles of less than 30%.

42. The integrated circuit of claim 35, wherein said first and second clock signals have non-overlapping active phases.

43. The integrated circuit of claim 35, incorporated into an integrated circuit chip which also comprises other circuits, and comprising an output connected to inhibit the operation of the other circuits placed on the same chip, in the event of the overrunning of a voltage threshold at the input of the detection circuit or of the detection of a bottom threshold.

44. An integrated circuit, comprising:
a connection for receiving an input voltage;
connections for receiving multiple different clock signals;
a voltage-detection circuit, powered from said input voltage, having an input node, and connected to provide an output in a first state when and only when the voltage of said input node passes a predetermined limit voltage; and
a charge-transfer circuit, interposed between said power-supply voltage connection and said voltage-detection circuit, and comprising;
first and second capacitors, having respective capacitances in a predetermined ratio;
a first clocked switch connected to transfer said power-supply voltage onto said first capacitor, on a first active phase of said clock signal; and
a second clocked switch connected to connect said first and second capacitors, to effect charge sharing therebetween, on a second active phase of said clock signals which does not overlap with said first active phase; and
a third clocked switch connected to connect said second capacitor to said voltage detection circuit on an active phase of said clock signals which is different from said second active phase;
a clocked precharge switch connected to intermittently precharge said output node of said voltage-detection circuit, on an active phase of said clock signals which is different from said second active phase; and
latching circuitry powered from said input voltage, and connected to hold said output of said voltage-detection circuit out of said first state, but not to hold said output of said voltage-detection circuit in said first state.

45. The integrated circuit of claim 44, wherein all said clock signals are received both in true and in complemented forms, and each said switch consists of a parallel combination of an N-channel transistor with a P-channel transistor.

46. The integrated circuit of claim 44, wherein said voltage detection circuit comprises a transistor, clocked by said second clock signal, which forces the output of said voltage-detection circuit out of said first state during an active phase of said second clock signal.

47. The integrated circuit of claim 44, wherein said voltage detection circuit comprises a field-effect transistor having a gate connected to said input node.

48. The integrated circuit of claim 44, further comprising an unclocked load element connected to said input node of said voltage-detection circuit.

49. The integrated circuit of claim 44, wherein said voltage-detection circuit provides said output in said first state when the voltage at said input node rises above said predetermined limit voltage.

50. The integrated circuit of claim 44, wherein said clock signals are non-overlapping.

51. The integrated circuit of claim 44, wherein all said clock signals have duty cycles of less than 30%.

52. The integrated circuit of claim 44, incorporated into an integrated circuit chip which also comprises other circuits, and comprising an output connected to inhibit the operation of said other circuits placed on the same chip, in the event of the overrunning of said voltage threshold at said input node of said voltage-detection circuit or of the detection of a bottom threshold.

53. An integrated circuit, comprising:
 a connection for receiving an input voltage;
 connections for receiving multiple non-overlapping clock signals;
 a voltage-detection circuit, powered from said input voltage, having an input node, and connected to provide an output at an output node in a first state when and only when the voltage of said input node passes a predetermined limit voltage; and
 a charge-transfer circuit, interposed between said input voltage connection and said voltage-detection circuit, and comprising one or more capacitors interconnected with clocked transfer switches which are connected to intermittently transfer a voltage from said input voltage connection onto said capacitors, and to intermittently transfer a voltage from said capacitors to said input node of said voltage detection circuit, in dependence on the timing of said clock signals;
 a clocked precharge switch connected to intermittently precharge said output node of said voltage-detection circuit, during at least some times when voltage is not being transferred from said capacitors to said input node, away from said first state; and
 latching circuitry powered from said input voltage, and connected to hold said output of said voltage-detection circuit out of said first state.

54. The integrated circuit of claim 53, wherein all said clock signals are received both in true and in complemented forms, and each said switch consists of a parallel combination of an N-channel transistor with a P-channel transistor.

55. The integrated circuit of claim 53, wherein said voltage detection circuit comprises a transistor, clocked by said second clock signal, which forces the output of said voltage detection circuit out of said first state during an active phase of said second clock signal.

56. The integrated circuit of claim 53, wherein said voltage detection circuit comprises a field-effect transistor having a gate connected to said input node.

57. The integrated circuit of claim 53, wherein said voltage detection circuit provides said output in said first state if the voltage at said input node rises above predetermined limit voltage.

58. The integrated circuit of claim 53, further comprising an unclocked load element connected to said input node of said voltage-detection circuit.

59. The integrated circuit of claim 53, wherein all said clock signals have duty cycles of less than 30%.

60. The integrated circuit of claim 53, incorporated into an integrated circuit chip which also comprises other circuits, and comprising an output connected to inhibit the operation of the other circuits placed on the same chip, in the event of the overrunning of a voltage threshold at the input of the detection circuit or of the detection of a bottom threshold.

* * * * *